United States Patent
Ahn

(10) Patent No.: US 6,915,175 B2
(45) Date of Patent: Jul. 5, 2005

(54) METHOD AND DEVICE FOR PROGRAMMING NONVOLATILE SEMICONDUCTOR MEMORY

(75) Inventor: Jong-Keun Ahn, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 637 days.

(21) Appl. No.: 09/975,420

(22) Filed: Oct. 11, 2001

(65) Prior Publication Data

US 2002/0156539 A1 Oct. 24, 2002

(30) Foreign Application Priority Data

Apr. 18, 2001 (KR) ........................................ 2001-20764

(51) Int. Cl.[7] .............................................. G05B 19/42
(52) U.S. Cl. ............................. 700/87; 700/18; 700/86; 700/121; 711/102; 711/103; 365/189.04; 365/189.05; 365/219; 710/52; 710/53; 710/71; 326/37; 326/38
(58) Field of Search .............................. 700/18, 86, 87, 700/121; 711/102, 10.3; 365/189.04, 189.05, 219; 710/52, 53, 71; 326/37, 38

(56) References Cited

U.S. PATENT DOCUMENTS

| | | | | |
|---|---|---|---|---|
| 5,047,982 A | * | 9/1991 | Smith et al. ............ | 365/185.01 |
| 5,313,650 A | * | 5/1994 | Mitsuishi et al. ............ | 713/600 |
| 5,414,744 A | | 5/1995 | Levy | |
| 5,432,741 A | * | 7/1995 | Devore et al. ......... | 365/185.14 |
| 5,708,601 A | * | 1/1998 | McKenny et al. ...... | 365/185.09 |
| 5,761,732 A | * | 6/1998 | Shaberman et al. ......... | 711/157 |
| 5,790,572 A | * | 8/1998 | Oguro et al. ................ | 714/798 |
| 5,835,936 A | * | 11/1998 | Tomioka et al. ............ | 711/103 |
| 5,862,367 A | * | 1/1999 | Chiao-Yen .................... | 710/71 |
| 5,938,748 A | * | 8/1999 | Lynch et al. .................. | 710/53 |
| 6,009,496 A | * | 12/1999 | Tsai ........................... | 711/103 |
| 6,061,473 A | * | 5/2000 | Chen et al. .................. | 382/235 |
| 6,081,471 A | * | 6/2000 | Palazzi et al. .............. | 365/218 |
| 6,160,426 A | | 12/2000 | Lee | |
| 6,483,748 B2 | * | 11/2002 | Futatsuya et al. ...... | 365/185.11 |
| 6,535,780 B1 | * | 3/2003 | Anderson et al. ........... | 700/121 |
| 2001/0014037 A1 | * | 8/2001 | Kim et al. ............. | 365/185.18 |

FOREIGN PATENT DOCUMENTS

EP 0178 922 A2 4/1986

* cited by examiner

*Primary Examiner*—Anthony Knight
*Assistant Examiner*—Douglas Shute
(74) *Attorney, Agent, or Firm*—F. Chau & Associates, LLC

(57) ABSTRACT

A control system includes a nonvolatile memory chip and a controller. The controller transfers a group of data from exterior to the nonvolatile memory chip based on the capacity of the nonvolatile memory, and enables the programming of the transferred data in the nonvolatile memory chip while transferring a new group of data. When transferring the group of data to the memory chip, the controller determines whether all the data are transferred from the exterior to the controller, and, if the all the data are transferred to the controller, transfers the group of data to the memory chip. Also, the controller controls the period of the data programming according to the capacity of the nonvolatile memory. Thus, data transfer and program operations are performed at the same time regardless of the memory capacity.

17 Claims, 5 Drawing Sheets

METHOD AND DEVICE FOR PROGRAMMING NONVOLATILE SEMICONDUCTOR MEMORY

RELATED APPLICATION

This application claims priority upon Korean Patent Application No. 2001-20764, filed on Apr. 18, 2001, the contents of which are herein incorporated by reference in their entirety.

FIELD OF THE INVENTION

The present invention generally relates to a semiconductor integrated circuit device and, more particularly, to a method and a device for programming a nonvolatile semiconductor memory in a micro control system.

BACKGROUND OF THE INVENTION

It is well known that a nonvolatile memory embodied in a micro control system (or microcontroller) can continuously hold stored data even when power is turned off. The stored data of such a nonvolatile memory can be updated by two methods. One is a parallel interface method, and the other is a serial interface method. With the parallel interface method, the stored information is directly updated at the exterior by using an address, data, and a control signal. With the serial interface method, the stored information is updated by using clock and data signals having a constant speed. These interface methods can be realized by a dedicated interface circuit with or without a central processing unit (CPU).

If the parallel interface method is used to update the stored information of the nonvolatile memory, the nonvolatile memory in the micro control system can directly be controlled by address, data, and control signals. In other words, the nonvolatile memory embodied in the micro control system is controlled as an independent memory chip. However, this method requires a larger number of coupled signal lines, which complicates system design. If the serial interface method is used to update the stored information of the nonvolatile memory, a serial interface for controlling the nonvolatile memory is provided, and the stored information is updated by using clock and data signals or transmit/receive data signals.

Since a nonvolatile memory generally has various sizes, one large serial buffer is embedded in a control module for buffering the nonvolatile memory. After data fills the serial buffer, data corresponding to the serial buffer size is written into the nonvolatile memory. Thus, the memory control module can have a common serial programming interface for performing data inputting into the serial buffer and data writing into the nonvolatile memory at the same time. Bitlines, each corresponding to a size of the serial buffer or data bits stored therein, must be coupled to a memory cell array. Therefore, a large data bus is required.

Although there are advantages in use of the serial interface method, there are problems, such as, increased overhead including, increase in programming time, decrease in the drive capability of voltage pumping circuit, and increase in current consumed.

Considering a coupling state of a data bus as well as the driving capability and size of a voltage pumping circuit, a write data bus of a nonvolatile memory may have various widths, such as, 8-bit, 16-bit, and 32-bit. For example, the width of the write data path may be equal to that of a read data path. In this case, write time is short, and a consumed current of a voltage pumping circuit is reduced. However, a write operation must be performed in several times, and data processing must be varied with the bus width. If a common interface is used, the data processing must be compatible to the CPU.

To update the stored information of the nonvolatile memory through a serial interface, a new on-board programming method, which can update a nonvolatile memory by using the existing transfer protocol with little or no intervention of a CPU and selectively control a serial data transfer speed regardless of write data width of the nonvolatile memory is required.

SUMMARY OF THE INVENTION

An object of the present invention is to provide a method for programming a nonvolatile memory without a large-sized serial buffer.

Another object of the invention is to provide a control system comprising a memory controller capable of controlling a programming operation of a nonvolatile memory having a small-sized serial buffer.

According to one feature of the present invention, a method for programming a nonvolatile memory by a control system having a controller for controlling transfer of data to be programmed comprises the steps of: sequentially transferring and storing serial address bits from the exterior to the controller; sequentially transferring and storing a first group of serial data bits from the exterior to the controller; determining whether all the serial data bits of the first group are transferred to the controller; transferring the first group of serial data bits to the nonvolatile memory when all the serial data bits of the first group are transferred to the controller; and sequentially transferring and storing a second group of serial data bits to the controller, while programming the first group of the serial data bits in the nonvolatile memory at the address indicated by the address bits of the controller.

In a preferred embodiment, whenever the serial data bits of each group, except the serial data bits of the first group, is transferred to the controller, the address is increased. Each group of the serial data bits comprises one or more bytes.

According to another feature of the invention, a control system comprises a memory chip having a nonvolatile memory for storing data bits and programming the stored data bits; and a controller for determining the capacity of the nonvolatile memory, serially transferring a group of data bits to the nonvolatile memory based on the capacity of the nonvolatile memory, and enabling the programming of the group of data bits in the nonvolatile memory while transferring a next group of data bits to the nonvolatile memory.

In a preferred embodiment, the memory chip further comprises a write buffer for receiving and storing the group of data bits from the controller, and transferring the stored group of data bits to the nonvolatile memory, and a voltage generator for generating a voltage necessary for the programming in the nonvolatile memory. The controller comprises a data register for storing the group of data bits serially provided from exterior and transferring the group of data bits to the write buffer, the group of data bits being programmed in the nonvolatile memory; an address register for storing address bits serially provided from exterior, and transferring the stored address bits to the memory cell array, wherein the address bits are varied when the next group of data bits is transferred to the data register; and a control logic for making the group of data bits and address bit in the data and address registers transferred to the write buffer and the nonvolatile memory respectively and enabling a program enable signal for the performing of the stored data bits in the nonvolatile memory. In one preferred embodiment, the controller further comprises a byte select circuit for outputting a byte select signal indicating the capacity of the nonvolatile memory, wherein the control logic controls a enable period of the program enable signal based upon the byte select signal.

DESCRIPTION OF PREFERRED EMBODIMENTS

A micro control system (or microcontroller) according to the present invention employs a transfer protocol for programming an embedded nonvolatile memory by using a clock signal and a data signal or a transferring/receiving data signal. In the transfer protocol, the size of a data register (or serial buffer) is the same as or, larger than that of a write buffer (e.g., 1 byte to 4 bytes) in the nonvolatile memory chip. Data bits (e.g., 1 byte to 4 bytes) for updating the stored information in the nonvolatile memory are sequentially transferred from the exterior to the data register. The transferred data bits are loaded on a write buffer in the nonvolatile memory chip. The loaded data bits are programmed to an array of the nonvolatile memory. The next data bits to be programmed are sequentially transferred from the exterior to the data register while programming the previous loaded data bits in the memory. Since data transfer and program operations are performed at the same time, data can be transferred in a short amount of time without a large-sized buffer. Now, preferred embodiments of the present invention will be described more fully hereinafter with reference to accompanying drawings.

Figure 1:
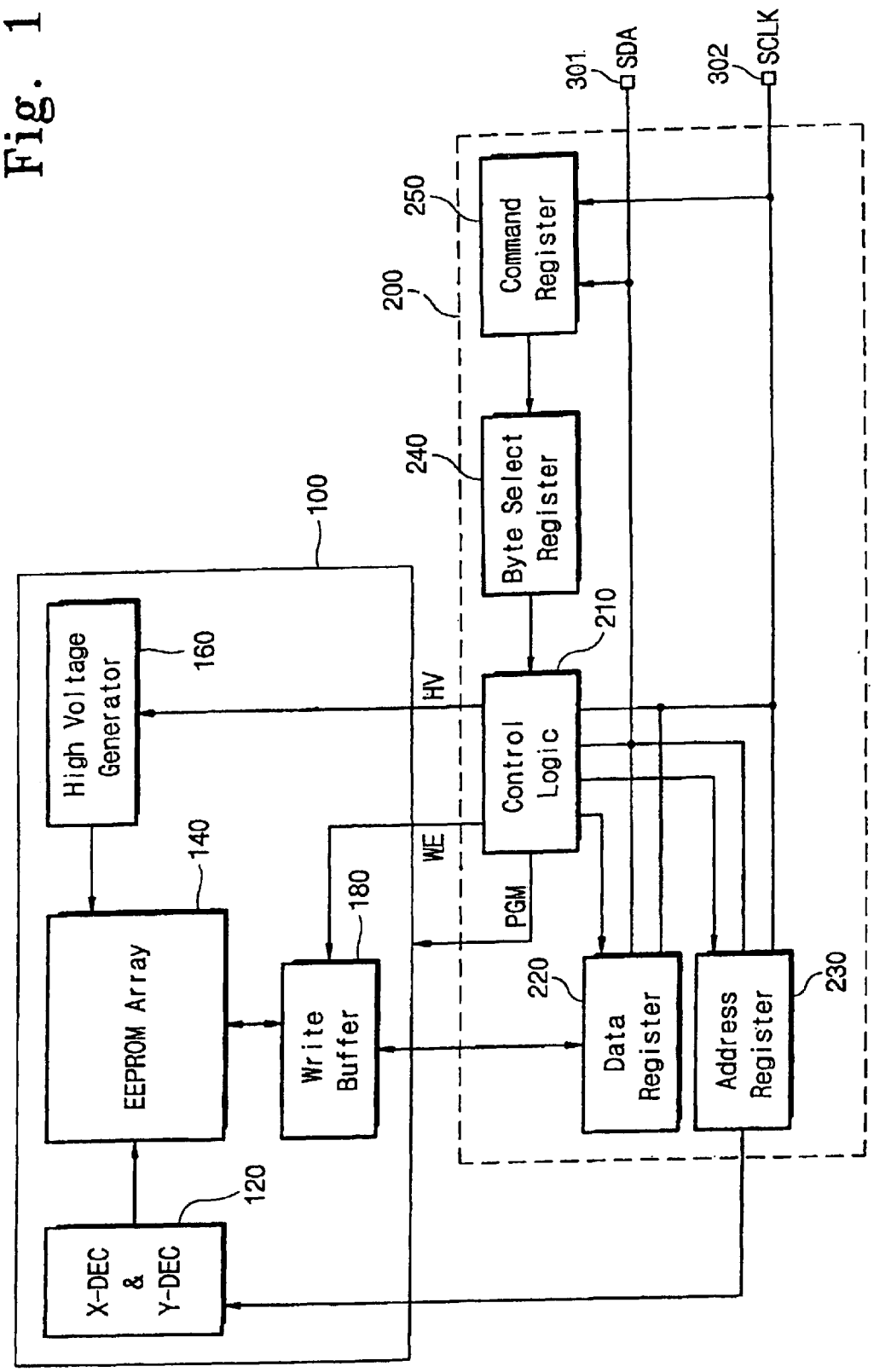
FIG. 1 is a block diagram showing a memory control system according to a first embodiment of the present invention.

FIG. 1 illustrates a control system having a memory chip 100 and a memory controller 200 according to a first embodiment of the invention. The memory chip 100 includes nonvolatile memory 140, which is electrically erasable and programmable. Erase/program/write operations of the nonvolatile memory chip 100 are controlled by a memory controller 200. The nonvolatile memory chip 100 includes a row & column decoder block (X-DEC & Y-DEC) 120, an EEPROM array 140, a high voltage generation block 160, and a write buffer 180. The EEPROM array 140 has electrically erasable and programmable memory cells arranged with rows (or wordlines) and columns (or bitlines). The row and column decoder block 120 selects a row (or wordline) and columns (or bitlines) of the array 140 along an address provided from the memory controller 200. The high voltage generation block 160 generates a voltage necessary for program/erase/write operations. The memory controller 200 loads data, being programmed to the array, on the write buffer 180 by using a control signal WE.

The memory controller 200 temporarily stores serial data bits sequentially provided from the exterior according to a serial interface manner, and transfers the stored data bits to the write buffer 180 of the nonvolatile memory chip 100. The memory controller 200 generates not only an address required for programming data bits but also control signals, and includes a control logic 210, a data register 220, an address register 230, a byte select register 240, and a command register 250.

The control logic 210 is coupled to a data pin 301 for receiving address & data (hereinafter referred to as "SDA") and a clock pin 302 for receiving a clock signal SCLK. If a program operation for updating the stored information of the nonvolatile memory chip 100 is started, the control logic 210 controls the data register 220 and the address register 230. Thus, data and address applied to the data pin 310 are synchronized with the clock signal SCLK, and stored in the data register 220 and the address register 230 respectively. The control logic 210 generates control signals PGM, WE, and HV for controlling the nonvolatile memory chip 100. The control signal WE is a signal for loading the data bits stored in the data register 220 on the write buffer 180. The control signal (or program enable signal) PGM is a signal for indicating an enable period of the programming of the loaded data bits to the EEPROM array 140. The control signal HV is a signal for enabling the high voltage generation block 160 to generate a high voltage necessary for a program operation.

The data register 220 is synchronized with the clock signal SCLK, and temporarily stores serial data bits of the data pin 301 under the control of the control logic 210, in which the serial data bits are sequentially applied from exterior to the data pin 301. The address register 230 is synchronized with the clock signal SCLK, and stores address bits sequentially applied to the clock pin 302 under the control of the control logic 210. The byte select register 240 outputs a select signal that indicates a write data bus width (or a write buffer size of the nonvolatile memory 100) based upon a programmed value of the command register 250. The command register 250 is coupled to the data pin 301 and the clock pin 302, synchronized with the clock signal SCLK, and programmed by data applied to the data pin 301. Programming the command register 250 is performed prior to a program operation for updating data stored in the nonvolatile memory chip 100. An enable period (or enable time) of the control signal PGM may be variable to the output of the byte select register 240.

Figure 2:
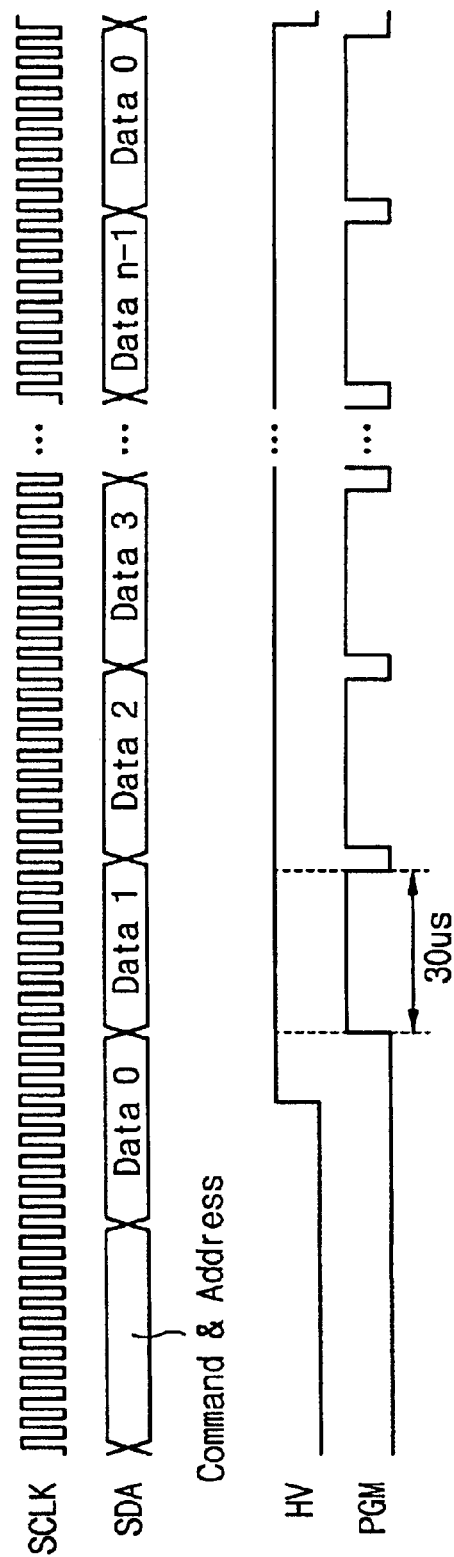
FIG. 2 is a timing diagram showing programming and transferring 1-byte data using the control system according to the first embodiment shown in FIG. 1.

FIG. 2 illustrates a timing view for explaining the program operation for updating stored information of the memory chip 100 controlled by the memory controller 200 according to the first embodiment of the invention. The program operation will now be described more fully hereinafter with reference to the FIG. 1 and FIG. 2. Assume that the capacity of the write buffer 180 in the nonvolatile memory 100 is 1 byte (8 bits).

When the program operation is started, the command register 250 is programmed by data informing a write data bus width (or write buffer size) of the nonvolatile memory chip 100. And, a byte select register 240 outputs the select signal indicating a write data bus width to the control logic 210 according to the programmed value of the command register 250. The control logic 210 recognizes the write buffer capacity of the nonvolatile memory chip 100, in this case, 1 byte according to the select signal, thereby sets an enable period of a control signal PGM. Then, as shown in FIG. 2, the command and address are sequentially applied to the data pin 301 from the exterior. The control logic 210 receives and analyzes the command and address applied to the data pin 301, and makes address bits. The address bits are synchronized with a clock signal SCLK. Thus, the clock signal SCLK is sequentially stored in the address register 230. Next to the command and address, data to be programmed (hereinafter referred to as "first program data") is applied to the data pin 301, and transferred to the data register 220 under the control of the control logic 210.

Before transferring all 1-byte data bits (i.e., first program data bits) to the data register 220, the control logic 210 enables a control signal LIV so that the high voltage generator 160 generates a high voltage required for a program operation in the memory 100. The control logic 210 detects a start bit and a stop bit of serial data SDA applied to the data pin 301. When the control logic 210 detects the start bit, the first program data bits of the data register 220 is loaded on a write buffer 180, and the address of the address register 230 is transferred to a row and column decoder block 120. At the same time, the control logic 210 enables the control signal PGM for performing the program operation of the first program data bits in the memory chip 100 for a predetermined time (e.g., 30 $\mu$s) according to a conventional method.

While the program operation of the first program data bits is performed in the memory chip 100 (or the control signal PGM is enabled), another 1-byte data bits (hereinafter referred to as "second program data bits"), being programmed in the memory chip 100 after the programming of the first program data, is synchronized with the clock signal SCLK under the control of the control logic 210, and stored in the data register 220. When detecting a stop bit in the second program data bits, the control logic 210 controls the address register 230 to increase an address by "1". At the same time, the control logic 210 makes the second program data bits of the data register 220 loaded on a write buffer 180, and makes an address of he address register 230 transferred to the row and column decoder block 120. Also the control logic 210 enables the control signal PGM for performing a program operation of the second program data in the memory chip 100. Then, the next programming data bits (a third program data bits) is transferred to the write buffer 180 of the nonvolatile memory chip 100 according to the above-described manner.

In summary, data serially transferred from the exterior is programmed to the nonvolatile memory chip 100 through the memory controller 200 using a data register 220 whose size is much smaller than the capacity of data to be programmed. Note that the time for transferring data bits to the data register 220 should not be shorter than the time for programming data bits or the enable time of the control signal PGM. If the transferring time is shorter than the programming time or the enabling time, the timing difference between the control signal PGM and address & data is not compensated. Thus, a program cannot be carried out.

Advantageously, the memory controller 200 according to the present invention can control the data programming and data transferring with the same performance regardless of the capacity change of write buffer 180. For example, even if the capacity of the data to be programmed is increased, that is, the capacity of the write buffer 180 is increased from 1 byte to 4 bytes, the memory controller 200 can control the memory chip 100 without changing the protocol. That is, the control logic 210 recognizes that the write buffer 180 has a capacity of 4 bytes according to the select signal of the byte select register 240 determined by the programmed value of the command register 250. The control logic 210 controls (adjusts) enable periods of the data register 220 and the control signal PGM, based upon the size information of a write buffer. Therefore, the data transfer operation and program operation according to a timing diagram shown in FIG. 3, even if the capacity of data to be programmed is different from that in FIG. 2, will be controlled with the same protocol as that in FIG. 2.

Figure 3:
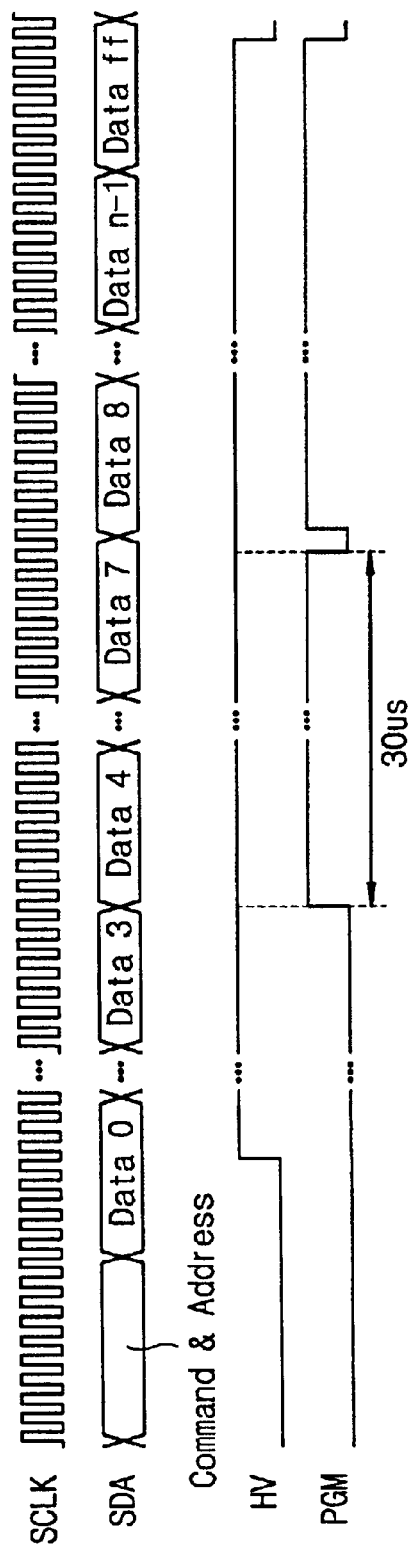
FIG. 3 is a timing diagram showing programming and transferring 4-byte data using the control system according to the first embodiment shown in FIG. 1.

If the time (e.g., 30 $\mu$s) for programming data in the memory is not beyond a current driving capability of a high voltage generation block 160t, the time is constant regardless of the size of the programmed data. Therefore, 4-byte data can be transferred within predetermined time, as shown in FIG. 3. A data transfer speed for transferring data to the data register 220 in this case increases more than that in a nonvolatile memory having 1-byte capacity. If the data transfer speed is determined on the basis of a nonvolatile memory having the longest programming time, such a transfer can be applied to all nonvolatile memories. That is, data transfer and program operations may be performed by the same manner irrespective of a transfer data size (or write buffer size).

Figure 4:
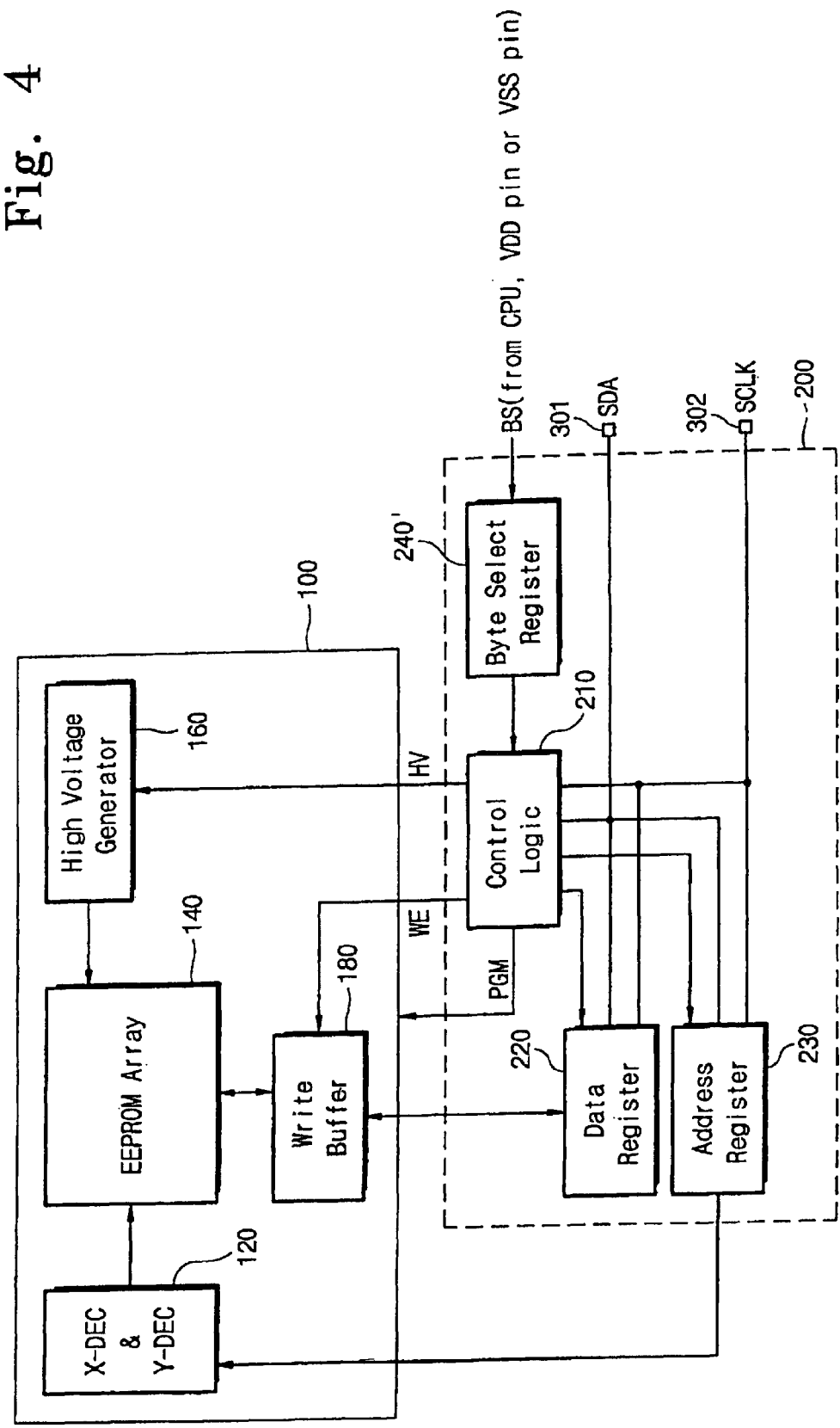
FIG. 4 is a block diagram of a control system according to a second embodiment of the invention.

FIG. 4 schematically illustrates a control system according to a second embodiment of the present invention. The control system according to the second embodiment is identical to that according to the first embodiment, except a control method of a byte select register 240'. The byte select circuit 240' of the control system according to the second embodiment may be programmed by a central processing unit (not shown) of the control system or may be programmed using a power supply voltage pin or a ground voltage pin. In order to avoid duplicate explanation, data transfer and program operations are skipped.

Figure 5:
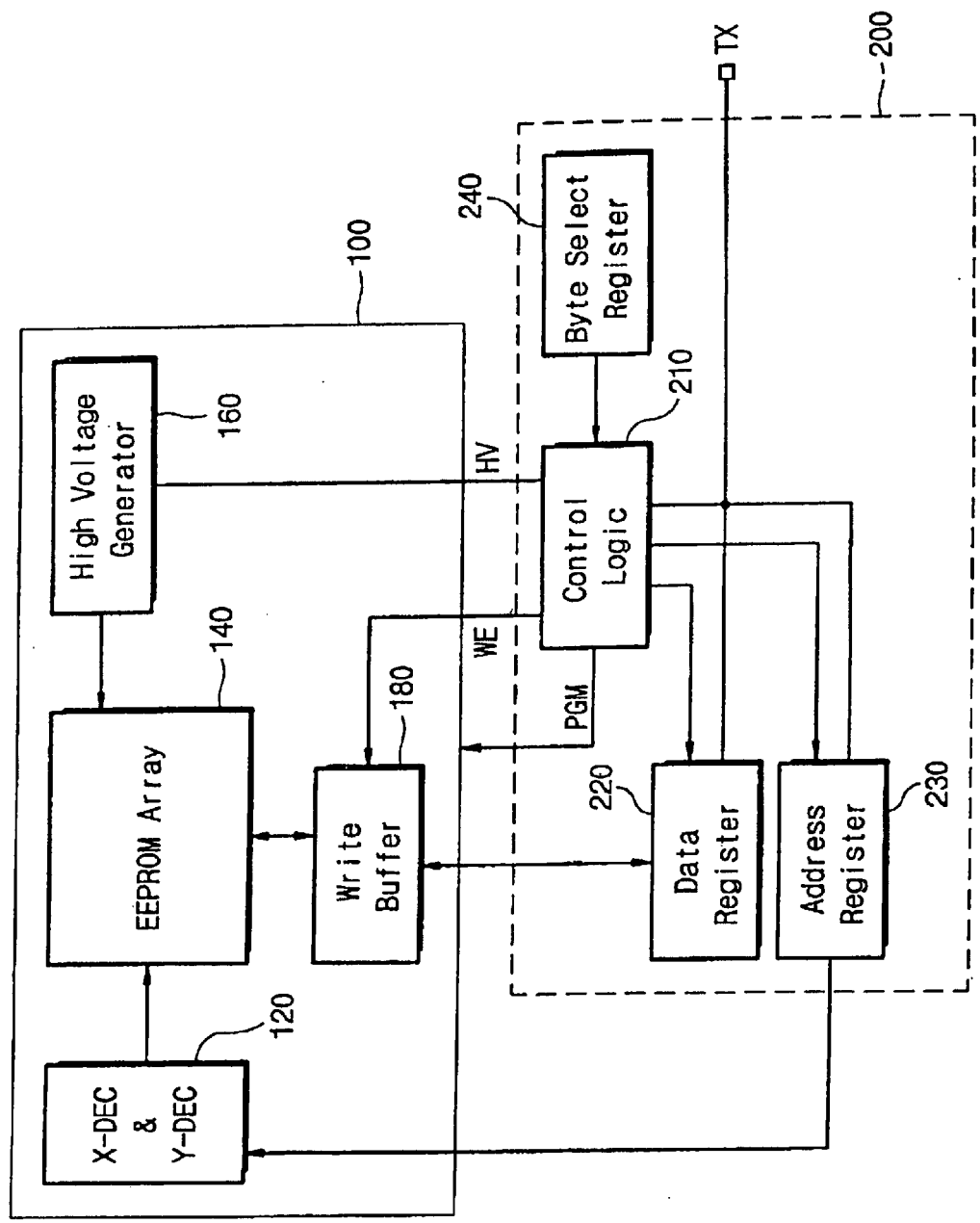
FIG. 5 is a block diagram of a control system according to a third embodiment of the invention.

FIG. 5 schematically illustrates construction of a control system according to a third embodiment of the present invention. Like numerals denote like components in FIG. 1 and FIG. 5, so that its description will be skipped herein. The third embodiment is substantially identical to the first and second embodiments, except that an asynchronous manner is used herein. Therefore, description of the third embodiment will be skipped herein.

While this invention has been particularly shown and described with reference to the preferred embodiments thereof, it will be understood by those skilled in the art that various changes in form and details may be made without departing from the spirit and scope of the invention.

What is claimed is:

1. A method for programming a nonvolatile memory by a control system having a controller for controlling transfer of data to be programmed, the method comprising the steps of:

sequentially transferring and storing serial address bits from the exterior to the controller;

sequentially transferring and storing a first group of serial data bits from the exterior to the controller;

determining whether all the serial data bits of the first group are transferred to the controller;

transferring the first group of serial data bits to the nonvolatile memory when all the serial data bits of the first group are transferred to the controller; and sequentially transferring and storing a second group of serial data bits to the controller, while programming the first group of serial data bits in the nonvolatile memory at the address indicated by the address bits.

2. The method of claim 1 further comprising, before the step of transferring the serial address bits to the controller, the steps of:

determining the capacity of the nonvolatile memory; and setting an enable period of the programming in the nonvolatile memory according to the result of the step of determining the capacity of the nonvolatile memory.

3. The method of claim 1 further comprising, before the step of programming the first group of serial data bits in the nonvolatile memory, generating a voltage enable signal necessary for the programming.

4. The method of claim 1 wherein whether all the serial data bits are transferred to the controller is determined by detecting a stop bit in the serial data bits.

5. The method of claim 1, wherein the address is increased whenever all the serial data bits of the respective group, except the serial data bits of the first group, are transferred to the controller.

6. The method of claim 1, wherein each group of the serial data bit comprises 1 byte or more.

7. The method of claim 1, wherein the nonvolatile memory is embodied in the control system.

8. A control system comprising:

a memory chip having a nonvolatile memory for storing data bits and programming the stored data bits; and a controller for determining the capacity of the nonvolatile memory, serially transferring a group of data bits to the nonvolatile memory based on the capacity of the nonvolatile memory, and enabling the programming of the group of data bits in the nonvolatile memory while a next group of data bits is transferred to the controller.

9. The control system of claim 8 wherein the memory chip further comprises a write buffer for receiving and storing the group of data bits from the controller, and transferring the stored group of data bits to the nonvolatile memory.

10. The control system of claim 9 wherein the memory chip further comprises voltage generator for generating a voltage necessary for the programming in the nonvolatile memory.

11. The control system of claim 8 wherein the controller comprises:

a data register for storing the group of data bits serially provided from exterior and transferring the group of data bits to the write buffer, the group of data bits being programmed in the nonvolatile memory;

an address register for storing address bits serially provided from exterior, and transferring the stored address bits to the nonvolatile memory, wherein the address bits are varied when the next group of data bits is transferred to the data register; and a control logic for making the group of data bits and address bits in the data and address registers transferred to the write buffer and the nonvolatile memory respectively and enabling a program enable signal for the programming of the stored data bits in the nonvolatile memory.

12. The control system of claim 11 wherein the controller further comprises a byte select circuit for outputting a byte select signal indicating the capacity of the nonvolatile memory, wherein the control logic controls an enable period of the program enable signal based upon the byte select signal.

13. The control system of claim 12 wherein the transferring time of the group of serial data bits is the same or is longer than the enable period of the program enable signal.

14. The control system of claim 12 wherein the byte select circuit sets the byte select signal before the transferring of the address bits and the group of data bits are started.

15. The control system of claim 12 wherein the controller further comprises a command register for receiving information for the capacity of the nonvolatile memory.

16. The control system of claim 15 wherein the byte select circuit sets the byte select signal according to the information of the command register.

17. The control system of claim 12 wherein the byte select circuit sets the byte select signal by using one of a central processing unit of the control system and a ground voltage pin.

* * * * *